United States Patent
Feurle et al.

(10) Patent No.: US 6,205,044 B1
(45) Date of Patent: Mar. 20, 2001

(54) DECODER CONNECTION CONFIGURATION FOR MEMORY CHIPS WITH LONG BIT LINES

(75) Inventors: Robert Feurle, Neubiberg; Sabine Mandel; Helmut Schneider, both of München, all of (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/510,641

(22) Filed: Feb. 22, 2000

(30) Foreign Application Priority Data

Feb. 19, 1999 (DE) ................................ 199 07 176

(51) Int. Cl.$^7$ ..................................... G11C 5/06
(52) U.S. Cl. .................. 365/63; 365/51; 257/776
(58) Field of Search ................ 365/63, 51, 226, 365/214; 257/776, 907

(56) References Cited

U.S. PATENT DOCUMENTS

| | | | |
|---|---|---|---|
| 4,977,542 | 12/1990 | Matsuda et al. ..................... | 365/207 |
| 5,251,168 | * 10/1993 | Chung et al. ......................... | 365/51 |
| 5,534,732 | * 7/1996 | DeBrosse et al. .................... | 257/776 |
| 5,625,234 | * 4/1997 | Suzuki et al. ........................ | 257/773 |
| 5,821,592 | * 10/1998 | Hoenigschmid et al. ........... | 257/390 |
| 5,864,496 | * 1/1999 | Mueller et al. ...................... | 365/69 |
| 6,034,879 | * 3/2000 | Min et al. ............................. | 365/63 |
| 6,069,815 | * 5/2000 | Mueller et al. ...................... | 365/63 |

* cited by examiner

Primary Examiner—Richard Elms
Assistant Examiner—Hien Nguyen
(74) Attorney, Agent, or Firm—Herbert L. Lerner; Laurence A. Greenberg; Werner H. Stemer

(57) ABSTRACT

A decoder connection configuration for memory chips, in which, in a dummy region of a decoder, the dummy region being caused by a bit line twist, additional plated-through holes are provided between power supply lines and the decoder. By virtue of the bit line twist, the coupling capacitance is practically halved on account of the electrical symmetry.

4 Claims, 2 Drawing Sheets

DECODER CONNECTION CONFIGURATION FOR MEMORY CHIPS WITH LONG BIT LINES

BACKGROUND OF THE INVENTION

FIELD OF THE INVENTION

The present invention relates to a decoder connection configuration for memory chips having:

long bit lines running in a first direction;

word lines, which cross the bit lines in a memory cell array and run in a second direction;

word line decoders, which lie in a decoder region and form a first metallization plane, the decoder region adjoining an edge of the memory cell array that runs in the first direction; and supply lines for the decoder, which are routed in the decoder region in a second metallization plane lying above the first metallization plane, respective plated-through holes being provided between the two metallization planes at lateral edges of the decoder region.

Array segments of integrated semiconductor memories and hence memory cell arrays are intended to be configured as large as possible in order to be able to store as much information as possible in each individual memory cell array. As contiguous array segments become larger, however, row decoders and/or row drivers also become longer, with the result that it becomes increasingly difficult to connect the decoders to power supply networks in a low-impedance manner.

At the present time, row decoders, as indicated in the introduction, are provided parallel to the bit lines at the edge of a memory cell array and, at the same time, are connected to a power supply network via plated-through holes in each case only at their ends. An existing configuration of this type is formed of memory cell array having word lines running in a y-direction and bit lines disposed in an x-direction. A decoder region is provided parallel to the bit lines at the edge of the memory cell array in the x-direction, in which decoder region the individual word lines and their decoders lie extremely close together. A row of power supply lines that are parallel to one another is provided in a second metallization plane above the decoders, which form a first metallization plane, in a manner insulated by a silicon dioxide layer. The power supply lines are electrically connected to the decoders only at the edge of the decoder region via plated-through holes running through the silicon dioxide layer. It is not possible for the plated-through holes to be provided in the course of the power supply lines, for instance in the center thereof, which is due to the fact that, in the metallization plane situated underneath, individual decoders and their word lines lie closely beside one another. Existing decoder connection configurations thus have the plated-through holes only at the edges of the decoder regions that adjoin the memory cell array.

It is a matter of great importance that the individual decoders be connected to the power supply lines with the lowest possible impedance, this currently being effected by the two-sided plated-through hole, at the two ends of the decoder region. Other possibilities consist in implementing the power supply lines as metal tracks that are as wide as possible, or in providing the decoders on both sides of the bit lines.

However, all these measures are associated with a higher area requirement, which is undesirable.

SUMMARY OF THE INVENTION

It is accordingly an object of the invention to provide a decoder connection for memory chips with long BIT lines which overcomes the above-mentioned disadvantages of the prior art devices of this general type, in which a decoder connection can be connected with minimum impedance to power supply lines, without an additional area requirement in a memory cell array.

With the foregoing and other objects in view there is provided, in accordance with the invention, a memory chip, including:

a memory cell array having an edge and a bit line twist region;

long bit lines running in the memory cell array in a first direction and forming bit-line twists in the bit line twist region;

word lines crossing the long bit lines in the memory cell array and running in a second direction;

a decoder region adjoining the edge of the memory cell array and running in the first direction, the decoder region having lateral edges and a zone adjoining the bit line twist region;

word line decoders lying in the decoder region in a first metallization plane;

supply lines for the word line decoders, routed in the decoder region in a second metallization plane lying above the first metallization plane; and a layer disposed between the first metallization plane and the second metallization plane and having plated-through holes formed therein running between the first metallization plane and the second metallization plane at the lateral edges of the decoder region, and additional plated-through holes formed in the layer running between the first metallization plane and the second metallization plane in the zone of the decoder region adjoining the bit line twist region.

The object is achieved according to the invention by virtue of the fact that in the memory cell array, the bit lines form a twist in a bit line twist region, and in that zone of the decoder region which adjoins the bit line twist region, additional plated-through holes are provided between the two metallization planes.

Thus, in the case of the decoder connection configuration according to the invention, unlike before, the two metallization planes are not connected to one another just at both ends of the decoder region, but rather at least one further time, for example in the center of the decoder region. For a realization of this additional connection of the two metallization planes which is neutral in terms of area, use is advantageously made of that zone of the decoder region which corresponds to the bit line twist region in the memory cell configuration.

In addition, by virtue of the bit line twist for the bit lines, the coupling capacitance thereof is practically halved on account of the twist, with the result that the bit lines can be configured to be longer than if there were no twists. In addition, it is possible to reduce the number of sense amplifiers on account of the smaller coupling capacitance, since practically every second sense amplifier can be omitted.

The invention thus makes it possible to reduce the power supply lines to approximately a quarter of their previous thickness or practically to double the length of the decoder region, without having to accept a reduction in the switching speed due to higher capacitances or RC constants.

Other features which are considered as characteristic for the invention are set forth in the appended claims.

Although the invention is illustrated and described herein as embodied in a decoder connection for memory chips with long BIT lines, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
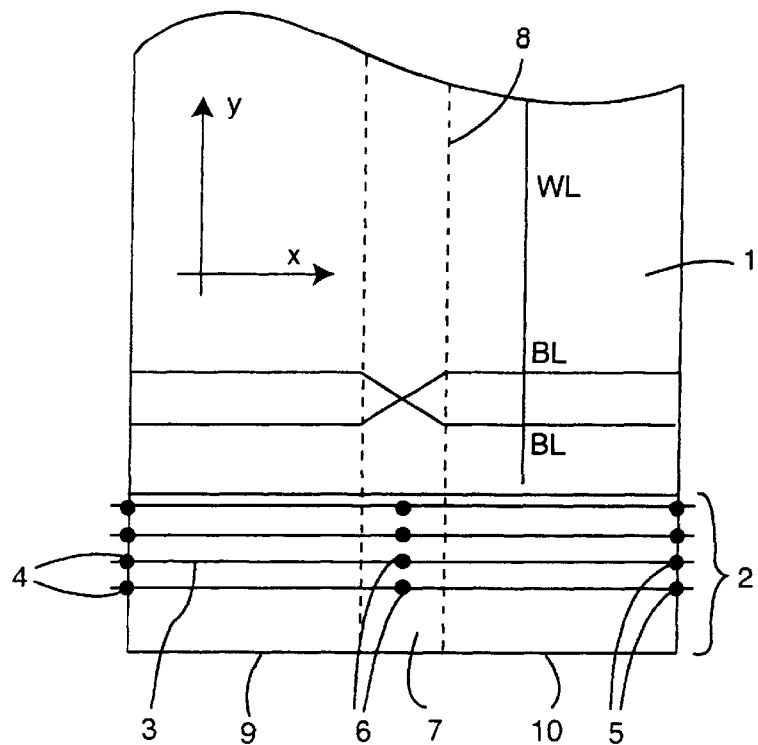
FIG. 1 a diagrammatic, plan view of a decoder connection configuration according to an exemplary embodiment of the invention.

In all the figures of the drawing, sub-features and integral parts that correspond to one another bear the same reference symbol in each case. Referring now to the figures of the drawing in detail and first, particularly, to FIG. 2 thereof, there is shown a known configuration of a memory cell array 1 having word lines WL running in a y-direction and bit lines BL disposed in an x-direction. In order to simplify the drawing, only one word line WL and two bit lines BL are illustrated. A decoder region 2 is provided parallel to the bit lines BL at an edge of the memory cell array 1 in the x-direction, in which decoder region the individual word lines WL and their decoders lie extremely close together. A row of power supply lines 3 which are parallel to one another is provided in a second metallization plane above the decoders, which form a first metallization plane, in a manner insulated by a silicon dioxide layer. The power supply lines 3 are electrically connected to the decoders only at the edge of the decoder region 3 via plated-through holes 4, 5 running through the silicon dioxide layer. It is not possible for the plated-through holes 4, 5 to be provided in the course of the power supply lines 3, for instance in the center thereof, which is down to the fact that, in the metallization plane situated underneath, individual decoders and their word lines lie closely beside one another. Existing decoder connection configurations thus have the plated-through holes 4, 5 only at the edges of the decoder regions 2 that adjoin a memory cell array 1.

Figure 2:
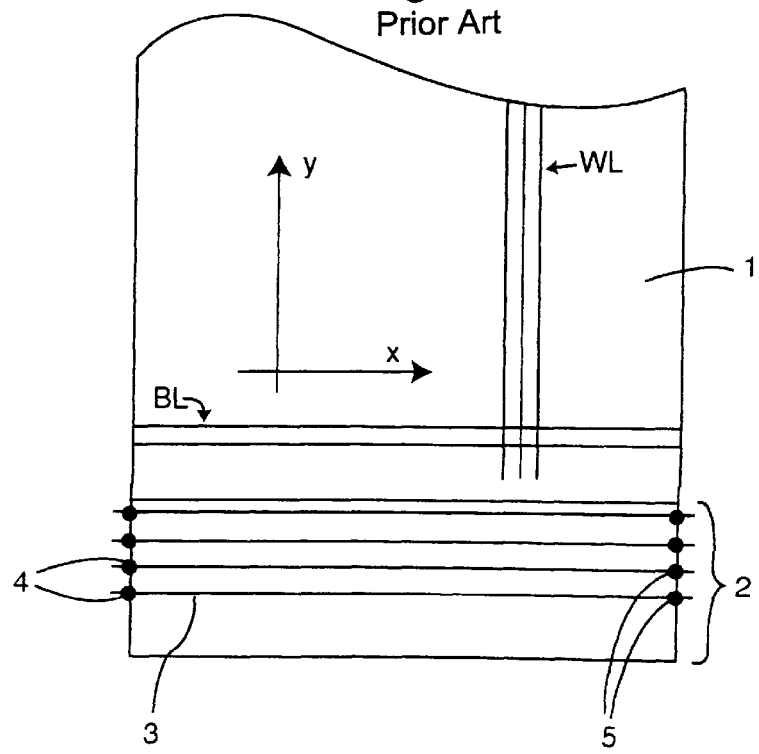
FIG. 2 is a plan view of a prior art decoder connection configuration.

It is a matter of great importance that the individual decoders be connected to the power supply lines 3 with the lowest possible impedance, this currently being effected by the two-sided plated-through hole 4 and 5, respectively, shown in FIG. 2, at the two ends of the decoder region 2. Other possibilities consist in implementing the power supply lines 3 as metal tracks which are as wide as possible, or in providing the decoders on both sides of the bit lines (that is to say at the top and at the bottom in FIG. 2). However, all these measures are associated with a higher area requirement, which is undesirable.

In contrast to the existing decoder connection configuration of FIG. 2, in the case of the decoder connection configuration according to the invention as shown in FIG. 1, the bit lines BL (not shown in more detail) running in the x-direction each effect a twist in a bit line twist region 8. In other words, two neighboring bit lines BL cross over one another here, with the result that, in the memory cell array 1 to the left of the bit line twist region 8, there runs a first bit line, which runs above a second bit line in the y-direction in FIG. 1, and the first bit line is led below the second bit line in that part of the memory cell array 1 which lies to the right of the bit line twist region, which second bit line is now above the first bit line here in the y-direction. By virtue of the bit line twist, the coupling capacitance is practically halved, in a known fashion, on account of the electrical symmetry. This halving of the coupling capacitance makes it possible to omit practically every second sense amplifier.

Figure 3:
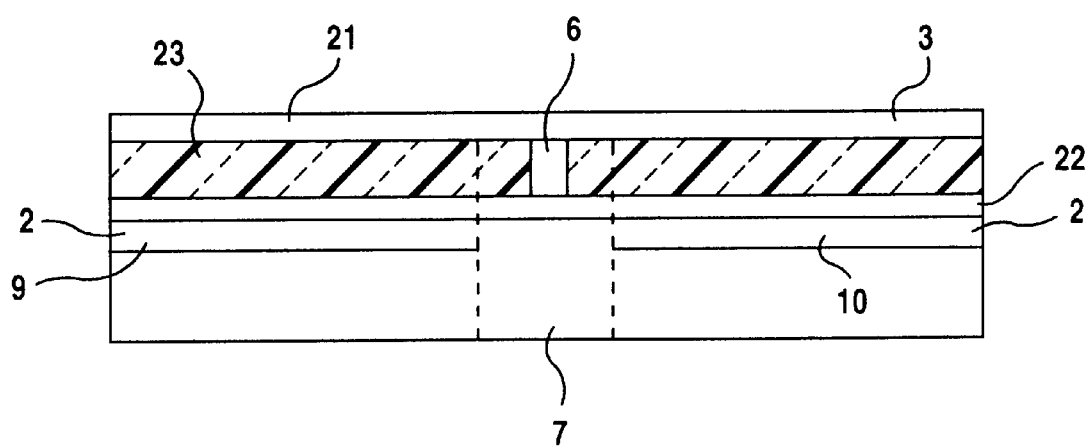
FIG. 3 is a sectional view of the decoder connection shown in FIG. 1 and according to the invention.

In the decoder region 2, there is now a dummy region 7 below the bit line twist region 8, no decoders being required in the dummy region 7 on account of the bit line twist in the region 8. The dummy region 7 splits the decoder region 2 into a first decoder region 9 and a second decoder region 10. According to the invention, the dummy region 7 is now utilized for additional plated-through holes 6 between the upper metallization plane 21 (see FIG. 3), having the power supply lines 3, and the lower metallization plane 22 of the decoders. The plated-through holes 6 are formed in the silicon dioxide layer 23 that insulates the upper metallization layer 21 from the lower metallization layer 22.

The width of the bit line twist region 8 is approximately 2.4 μm, for example, while the memory cell array 1 to the left and right of the bit line twist region 8 has a width of approximately 200 μm. In other words, the entire memory cell array 1 has a width of slightly more than 400 μm. It goes without saying that other numerical values for example smaller numerical values given a higher level of technology, can also be chosen.

Thus, like the bit line twist region 8, the dummy region 7 likewise has a width of approximately 2.4 μm. This width is entirely sufficient for the desired plated-through holes between the two metallization planes 21, 21. The additional plated-through holes 6 in the dummy region 7 provide a low-impedance connection between the power supply lines 3 and the decoders in the decoder region 2.

Thus, in contrast to the prior art, in the case of the decoder connection configuration according to the invention, unlike before, the two metallization planes are not contact-connected to one another only at the two ends of the region 2. Rather, such contact-connection is also implemented in the center of the region 2 via the plated-through holes 6. It goes without saying that it is also possible, if appropriate, to provide additional plated-through holes if corresponding further dummy regions 7 are used. Moreover, the invention is not limited to row decoders, that is to say to configurations running in the row direction, as is illustrated in FIG. 1. Rather, the invention can also be applied in the column direction.

The additional area requirement of approximately 2.4 μm caused by the invention is extremely small. Moreover, the additional area requirement is more than compensated for by the saving in area for sense amplifiers on account of the twist in the bit lines.

We claim:

1. A memory chip, comprising:
   a memory cell array having an edge and a bit line twist region;
   long bit lines running in said memory cell array in a first direction and forming bit-line twists in said bit line twist region;
   word lines crossing said long bit lines in said memory cell array and running in a second direction;

a decoder region adjoining said edge of said memory cell array and running in said first direction, said decoder region having lateral edges and a zone adjoining said bit line twist region;

word line decoders lying in said decoder region in a first metallization plane;

supply lines for said word line decoders, routed in said decoder region in a second metallization plane lying above said first metallization plane; and a layer disposed between said first metallization plane and said second metallization plane and having plated-through holes formed therein running between said first metallization plane and said second metallization plane at said lateral edges of said decoder region, and additional plated-through holes formed in said layer running between said first metallization plane and said second metallization plane in said zone of said decoder region adjoining said bit line twist region.

2. The memory cell according to claim 1, wherein said decoder region has a dummy region and said additional plated-through holes lie in said dummy region.

3. The memory cell according to claim 1, wherein said bit line twist region has a width of approximately 2.4 $\mu$m.

4. The memory cell according to claim 1, wherein said memory cell array has a width in said first direction of approximately 400 $\mu$m.

\* \* \* \* \*